(12) United States Patent
Mousavi Iraei et al.

(10) Patent No.: US 12,249,372 B2
(45) Date of Patent: Mar. 11, 2025

(54) ENCODING ADDITIONAL STATES IN A THREE-DIMENSIONAL CROSSPOINT MEMORY ARCHITECTURE

(71) Applicant: Intel Corporation, Santa Clara, CA (US)

(72) Inventors: Rouhollah Mousavi Iraei, Albuquerque, NM (US); Kiran Pangal, Fremont, CA (US); Saad P. Monasa, Sacramento, CA (US); Mini Goel, Milpitas, CA (US); Raymond Zeng, Cupertino, CA (US); Hemant P. Rao, Albuquerque, AZ (US)

(73) Assignee: Intel Corporation, Santa Clara, CA (US)

( * ) Notice: Subject to any disclaimer, the term of this patent is extended or adjusted under 35 U.S.C. 154(b) by 658 days.

(21) Appl. No.: 17/408,352

(22) Filed: Aug. 20, 2021

(65) Prior Publication Data

US 2023/0064007 A1     Mar. 2, 2023

(51) Int. Cl.
*G11C 16/04* (2006.01)
*G11C 13/00* (2006.01)
*H10B 63/00* (2023.01)

(52) U.S. Cl.
CPC ...... *G11C 13/0069* (2013.01); *G11C 13/0004* (2013.01); *G11C 13/0026* (2013.01); *G11C 13/0028* (2013.01); *G11C 13/004* (2013.01); *G11C 2013/0078* (2013.01); *H10B 63/84* (2023.02)

(58) Field of Classification Search
CPC ............ G11C 13/0069; G11C 13/0004; G11C 13/0026; G11C 13/0028; G11C 2013/0078
See application file for complete search history.

(56) References Cited

U.S. PATENT DOCUMENTS

| | | | |
|---|---|---|---|
| 7,986,549 B1 * | 7/2011 | Tang ................... | G11C 13/0069 365/185.21 |
| 8,953,360 B2 * | 2/2015 | Bedeschi ............ | G11C 11/5678 365/158 |
| 9,111,856 B2 * | 8/2015 | Pellizzer .............. | H10N 70/231 |

* cited by examiner

*Primary Examiner* — Pho M Luu
(74) *Attorney, Agent, or Firm* — Alliance IP, LLC

(57) ABSTRACT

A state may be encoded into a memory cell comprising a phase change material (PM) region and a select device (SD) region by: applying a first current in the memory cell over a first time period, wherein the first current applied over the first time period causes the PM region of the memory cell to be placed into an amorphous state and the SD region of the memory cell to be placed into an amorphous state; and applying a second current in the memory cell over a second time period after the first time period, wherein the second current applied over the third time period causes the SD region of the memory cell to be placed into a crystalline state and the PM region of the memory cell to remain in the amorphous state.

25 Claims, 12 Drawing Sheets

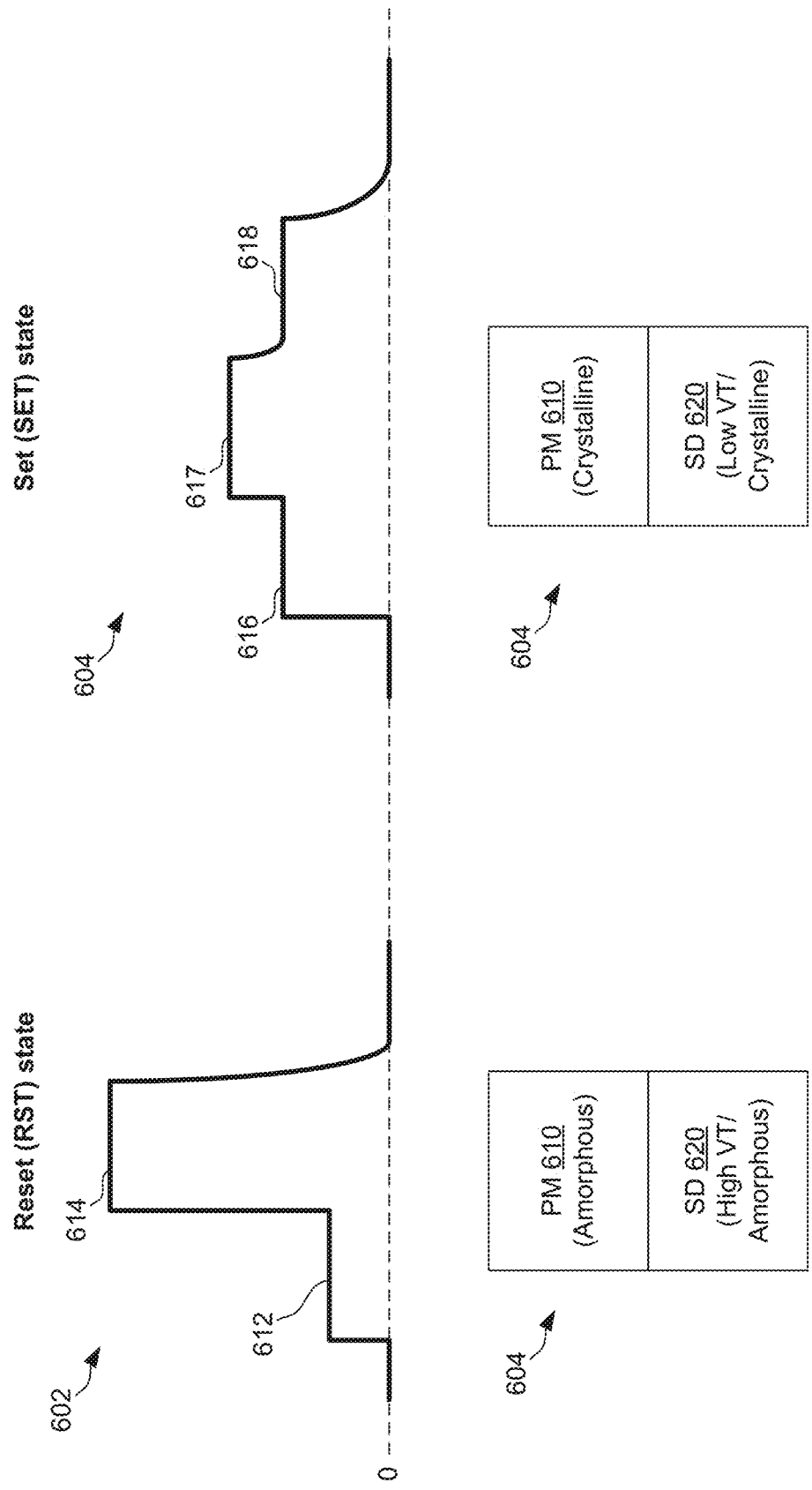

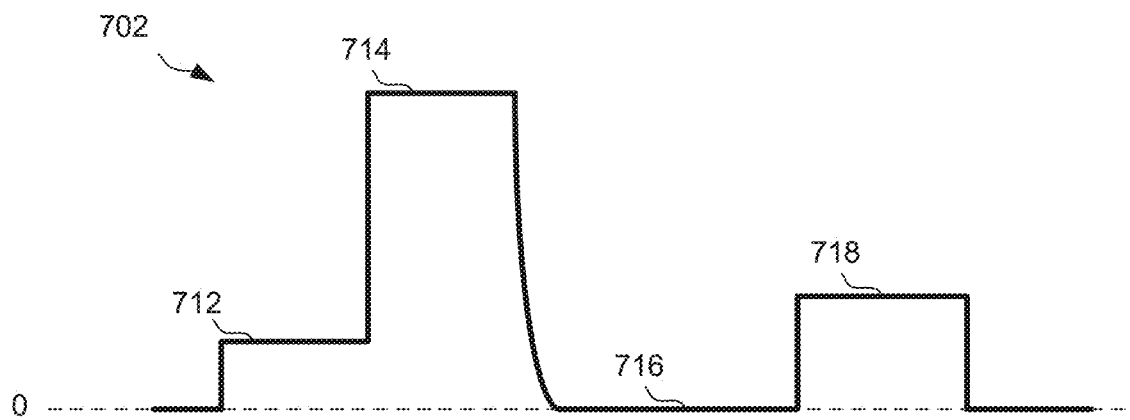
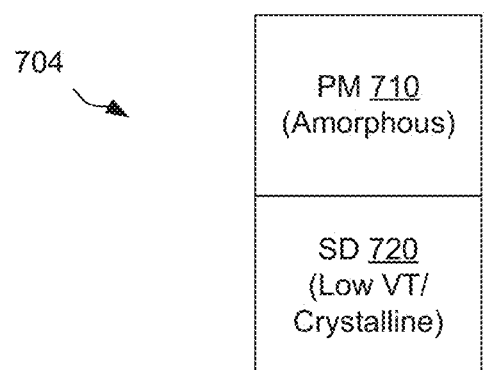
FIG. 7

MLC 2 State
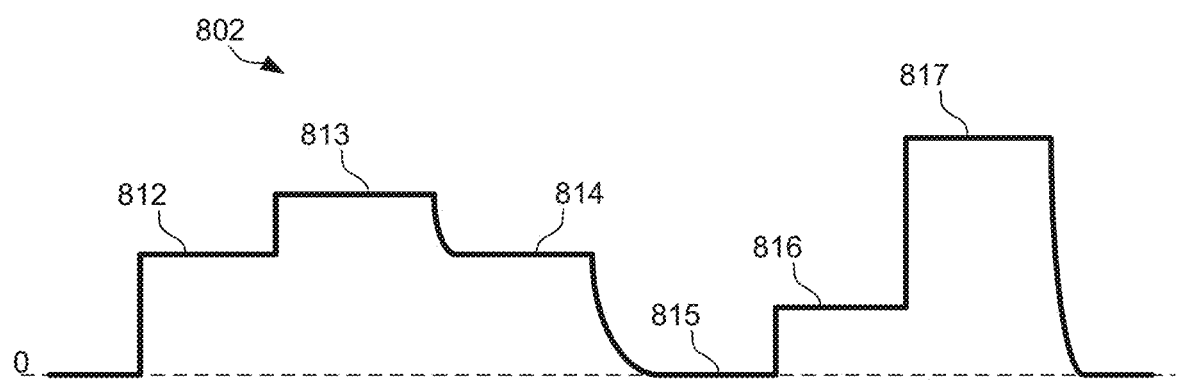
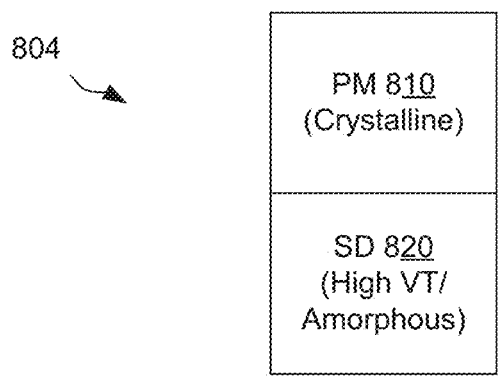
FIG. 8

ENCODING ADDITIONAL STATES IN A THREE-DIMENSIONAL CROSSPOINT MEMORY ARCHITECTURE

FIELD

The present disclosure relates in general to the field of computer development, and more specifically, to encoding additional states in a three-dimensional crosspoint memory architecture.

BACKGROUND

A storage device may include non-volatile memory, such as multi-stack 3D crosspoint memory cells or arrays. Currently, such memory cells may encode two states, which may be referred to the reset (RST) and set (SET) states (in some cases, these may refer to logic 0 and logic 1), based on the state of a phase change material in the memory cell.

BRIEF DESCRIPTION OF THE DRAWINGS

FIGS. 6A-6B illustrate example current waveforms that may place a memory cell of the present disclosure into a first and second state, respectively.

FIG. 7 illustrates an example current waveform that may place a memory cell of the present disclosure into a third state in accordance with embodiments of the present disclosure.

FIG. 8 illustrates an example current waveform that may place a memory cell of the present disclosure into a fourth state in accordance with embodiments of the present disclosure.

Like reference numbers and designations in the various drawings indicate like elements.

DETAILED DESCRIPTION

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
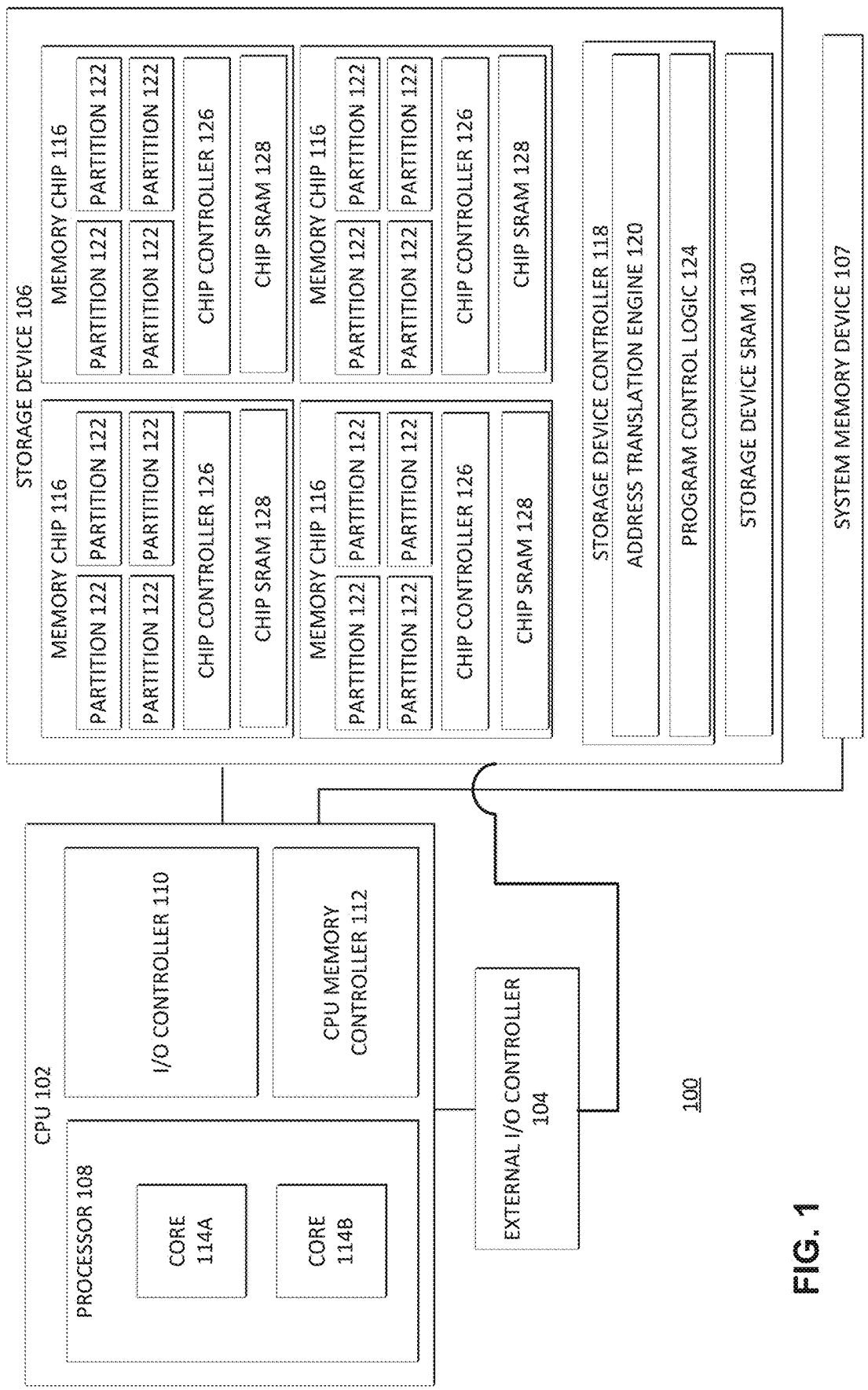
FIG. 1 is a schematic illustration of a block diagram of components of a computer system according to some embodiments.

FIG. 1 illustrates a block diagram of components of a computer system 100 in accordance with some embodiments. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition 122 may include a 3D crosspoint memory array. In some embodiments, a 3D crosspoint memory array may comprise a transistor-less (e.g., at least with respect to the data storage elements of the memory) stackable crosspoint architecture in which memory cells sit at the intersection of row address lines and column address lines arranged in a grid.

During a read operation, a differential bias sometimes referred to as a demarcation voltage (VDM) may be applied across the terminals of the memory cell and the state of the memory cell may be sensed based on the reaction of the memory cell to the applied bias. For example, the memory cell may either go into a conductive ON state (logic one) or remain in a weakly conductive OFF state (logic zero). The applied voltage at which a memory cell transitions from being sensed as a logic one to being sensed as a logic zero may be termed a threshold voltage of the memory cell. Thus, as an example, when the VDM is higher than the threshold voltage of the memory cell, the memory cell may be sensed as storing a logic one and when the VDM is lower than the threshold voltage of the memory cell, the memory cell may be sensed as storing a logic zero.

CPU 102 comprises a processor 108, such as a microprocessor, an embedded processor, a digital signal processor (DSP), a network processor, a handheld processor, an application processor, a co-processor, an SOC, or other device to execute code (e.g., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

A processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

The processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable logic capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise storage device controller 118 of storage device 106 coupled to the CPU 102 through I/O controller 110. I/O circuitry (not shown) of the storage device controller 118 may be used for communication of data and signals between the CPU and the storage device controller 118 of storage device 106.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI. Specification, Rev. 1.3.1 available at http://www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces. According to an alternative embodiment, the external I/O controller 104 may be used to couple of the CPU 102 to I/O devices other than the storage device 106, and the storage device 106 may be directly coupled to the CPU 102.

In the instant disclosure, I/O controller 110, CPU memory controller 112, external I/O controller 104 may each be referred to, from the standpoint of the storage device 106, as an "external controller."

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that maintains its state even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory partition may include non-volatile memory and/or volatile memory.

Non-volatile memory is a storage medium that does not require power to maintain the state of data stored by the medium, thus non-volatile memory may have a determinate state even if power is interrupted to the device housing the memory. In various embodiments, non-volatile memory may be byte or block addressable. Nonlimiting examples of nonvolatile memory may include any or a combination of: solid state memory (such as planar or 3-dimensional (3D) NAND flash memory or NOR flash memory), 3D crosspoint memory, phase change memory or SXP memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. A storage device 106 may store data and/or sequences of instructions that are executed or otherwise used by the cores 114A and 114B. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three-dimensional structures, sectors, or in other ways. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a solid state drive; a memory card; a Universal Serial Bus (USB) drive; a Non-Volatile Dual In-line Memory Module (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

System memory device 107 and storage device 106 may comprise any suitable types of memory and are not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A system memory device 107 or storage device 106 may also include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to the memory chips 116, and provide data associated with the requests to CPU 102 (e.g., via CPU memory controller 112 or I/O controller 110). Storage device controller 118 may also be operable to detect and/or correct errors encountered during memory operations via an error correction code (ECC engine). In an embodiment, controller 118 also tracks, e.g., via a wear leveling engine, the number of times particular cells (or logical groupings of cells) have been written to in order to perform wear leveling, detect when cells are nearing an estimated number of times they may be reliably written to, and/or adjust read operations based on the number of times cells have been written to. In performing wear leveling, the storage device controller 118 may evenly spread out write operations among the cells of memory chips 116 in an attempt to equalize the number of operations (e.g., write operations) performed by each cell. In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

In various embodiments, the storage device controller 118 may send commands to memory chips 116 to perform host-initiated read operations as well as device-initiated read operations. A host-initiated read operation may be performed in response to reception of a read command from a host coupled to the storage device 106, such as CPU 102. A device-initiated read operation may be a read operation that is performed in response to a device-initiated read command generated by the storage device 106 independent of receiving a read command from the host. In various embodiments, the storage device controller 118 may be the component that generates device-initiated read commands. The storage device 106 may initiate a device-initiated read command for any suitable reason. For example, upon power up of a storage device, the storage device 106 may initiate a plurality of read and write-back commands to re-initialize data of the storage device 106 (e.g., to account for any drift that has occurred while the storage device 106 or a portion thereof was powered off or has sat idle for a long period of time).

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (e.g., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Storage device SRAM/DRAM 130 and chip SRAM/DRAM 128 each are adapted to execute internal firmware or software of the storage device 106 and memory chip 116, respectively. For example, the logic to be implemented by program control logic 124, upon the issuance of a command, for example from the host or CPU 102 to execute the logic, may be moved from a memory storing the logic to SRAM/DRAM 130 such that the logic may be executed by the storage device controller 118 which will have access to the logic instructions by way of the associated SRAM/DRAM 128. Similarly, the logic to be implemented by the chip controller 126, upon the issuance of a command, for example from the host or CPU 102 to execute the logic, may be moved from a memory storage the logic to the associated SRAM/DRAM 128 (or another type of memory) such that the logic may be executed by the associated chip controller 126 which will have access to the logic instructions by way of the associated SRAM/DRAM 128.

Figure 2:
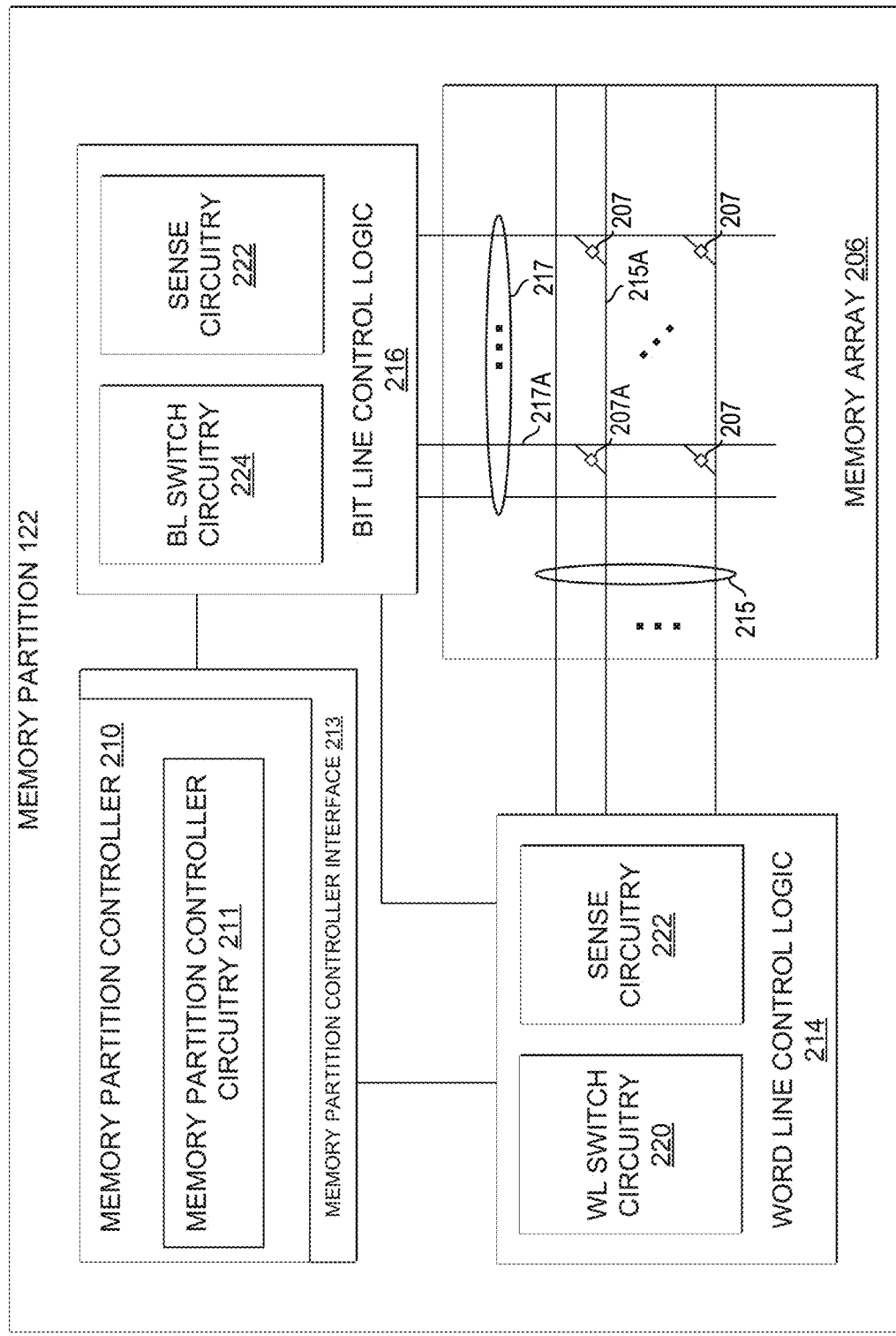
FIG. 2 is a schematic illustration of a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In a particular embodiment, phase change memory may utilize a chalcogenide material for memory elements. A memory element is a unit of a memory cell that actually stores the information. In operation, phase change memory may store information on the memory element by changing the phase of the memory element between amorphous and crystalline phases. The memory element (e.g., that includes a phase change material such as a chalcogenide material) may be referred to as a "PM" portion of the memory cell. The material of a memory element (e.g., the chalcogenide material) may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell 207 (e.g., a phase change memory cell) that also includes a selector, e.g., a select device (SD) coupled to the memory element. The SD regions of the memory cell 207 may be configured to facilitate combining a plurality of memory elements into an array. The SD region of the memory cell 207 may be made of, or include, a chalcogenide material. The SD region may be made of a different chalcogenide material than the PM region.

In some embodiments, a 3D crosspoint memory array 206 may comprise a transistor-less (e.g., at least with respect to the data storage elements of the memory) stackable crosspoint architecture in which memory cells 207 sit at the intersection of row address lines and column address lines arranged in a grid. The row address lines 215 and column address lines 217, called word lines (WLs) and bit lines (BLs), respectively, cross in the formation of the grid and each memory cell 207 is coupled between a WL and a BL where the WL and BL cross (e.g., at a crosspoint). At the point of a crossing, the WL and BL may be located at different vertical planes such that the WL crosses over the BL but does not physically touch the BL. As described above, the architecture may be stackable, such that a word line may cross over a bit line located beneath the word line and another bit line for another memory cell located above the word line. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell. In various embodiments, 3D crosspoint memory may include any of the characteristics of 3D XPoint memory manufactured by INTEL CORPORATION (Optane™ is the Intel Trademark for Intel's 3D crosspoint (3D Xpoint™) technology).

During a programming operation (e.g., a write operation), the phase of the memory element may be changed by the application of a first bias voltage to the WL and a second bias voltage to the BL resulting in a differential bias voltage across the memory cell that may cause a current to flow in the memory element. The differential bias voltage may be maintained across the memory cell for a time period sufficient to cause the memory element to "snap back" and to transition the memory element from the amorphous state to the crystalline state or from the crystalline state to the amorphous state (e.g., via the application of heat produced by an electric current). Snap back is a property of the composite memory element that results in an abrupt change in conductivity and an associated abrupt change in the voltage across the memory element.

In a read operation, a target memory cell is selected via the application of a first bias voltage to the selected WL and a second bias voltage to the selected BL that cross at the target memory cell for a time interval. A resulting differential bias voltage (a demarcation read voltage (VDM)) across the memory element is configured to be greater than a maximum set voltage and less than a minimum reset voltage for the memory element. Selection of the selected WL and selected BL and application of the first bias and second bias voltage may be implemented by a decoder in a switch circuitry, such as WL switch circuitry 220 and BL switch circuitry 240. In response to application of the VDM, the target memory element may or may not snap back, depending on whether the memory element is in the crystalline state (set) or the amorphous state (reset). Sense circuitry, coupled to the memory element, is configured to detect the presence or absence of snap back in a sensing time interval. The presence of snap back may then be interpreted as a logic one and the absence of snap back as a logic zero.

The differential bias at which a memory cell transitions from being sensed as a logic one (e.g., due to the memory cell snapping back) to being sensed as a logic zero (e.g., due to the memory cell not snapping back), may be termed a threshold voltage (sometimes referred to as a snap back voltage). Thus, when the VDM is higher than the threshold voltage of the memory cell, the memory cell may be sensed as storing a logic one and when the VDM is lower than the threshold voltage of the memory cell, the memory cell may be sensed as storing a logic zero.

In some embodiments, an applied bias such as the VDM of a read pulse may be high enough to only turn on 3D crosspoint cells in the crystalline state, which may have a lower threshold voltage than 3D crosspoint cells in the amorphous state. In some embodiments, the VDM may be supplied through negative and/or positive regulated nodes. For example, the bitline electrode of the 3D crosspoint cell may be a positive regulated node and the wordline electrode coupled to the cell may supply the bias for VDM.

For a write operation or a read operation, one memory cell 207A out of many cells, such as thousands of cells, may be selected as the target cell for the read or write operation, the cell being at the cross section of a BL 217A and a WL 215A. All cells coupled to BL 217A and all cells coupled to WL 215A other than cell 207A may still receive a portion of VDM (e.g., approximately ½ of VDM), with only cell 207A receiving the full VDM.

In the embodiment of FIG. 2, a memory partition 122 includes memory partition controller 210, word line control logic 214, bit line control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with word line control logic 214 and bit line control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of word lines 215, a plurality of bit lines 217 and a plurality of memory cells, e.g., memory cells 207. Each memory cell is coupled between a word line ("WL") and a bit line ("BL") at a crosspoint of the WL and the BL. Each memory cell includes a memory element configured to store information and may include a memory cell select device (e.g., selector) coupled to the memory element. Select devices may include ovonic threshold switches, diodes, bipolar junction transistors, field-effect transistors, etc. Memory array 206 may be configured to store binary data and may be written to (e.g., programmed) or read from.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command. Memory partition controller 210 may include memory partition controller circuitry 211, and a memory controller interface 213. Memory controller interface 213, although shown as a single block in FIG. 2, may include a plurality of interfaces, for example a separate interface for each of the WL control logic 214 and the BL control logic 216.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to a WL select bias voltage to select the respective WL 215A. For example, WL switch circuitry 220 may include a plurality of switches that each correspond to a particular WL. In one embodiment, each switch includes a pair of metal oxide semiconductor field effect transistors (MOSFETs) comprising a positive-type (p-type) metal oxide semiconductor transistor (PMOS) and a negative-type (n-type) MOS transistor (NMOS). The pair may form a complementary MOS circuit (CMOS).

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210. For example, a logic level corresponding to a logic one may be output if the applied VDM is higher than the memory cell's threshold voltage or a logic zero if the applied VDM is lower than the memory cell's threshold voltage. In a particular embodiment, a logic one may be output if a snap back is detected and a logic zero may be output if a snap back is not detected.

As an example, in response to a signal from memory partition controller 210, WL control logic 214 and BL control logic 216 may be configured to select a target memory cell, e.g., memory cell 207A, for a read operation by coupling WL 215A to WL select bias voltage and BL 217A to BL select bias voltage as well as coupling the other WLs and BLs to respective deselect bias voltages. One or both of sense circuitries 222 may then be configured to monitor WL 215A and/or BL 217A for a sensing interval in order to determine the state of the memory cell 207A (e.g., to determine whether or not a snap back event occurs). For example, if a sense circuitry 222 detects a snap back event, then memory cell 207A may be in the set state, but if a sense circuitry 222 does not detect a snap back event in the sensing interval, then memory cell 207A may be in the reset state.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a WL load connected to a WL electrode or gate, and a BL load connected to a BL electrode or gate. When a particular wordline and bitline are selected in the array, a difference between WL load or WL voltage and the BL voltage corresponds to a read VDM. VDM may induce a current (icell) in the memory cell 207A. A comparator such as a sense amplifier may compare icell with a reference current in order to read a logic state one or logic state zero depending on whether the memory cell is a set cell or a reset cell. The reference current may thus be selected such that the current of the target memory cell is lower than the reference current before snapback of the target memory cell and higher than the reference current after snapback of the target memory cell. In this manner, an output of the sense amplifier/comparator may be indicative of a state of the target memory cell. A latch may be coupled to the output of the comparator to store the output of the read operation.

For each matrix of arrays, there may be a number of sense amplifiers provided, with the sense circuitry 222 able to process up to a maximum number of sensed bits, such as 128 bits, from the sense amplifiers at one time. Hence, 128 memory cells may be sensed at one time by sense amplifiers of the sense circuitry 222.

Figure 3:
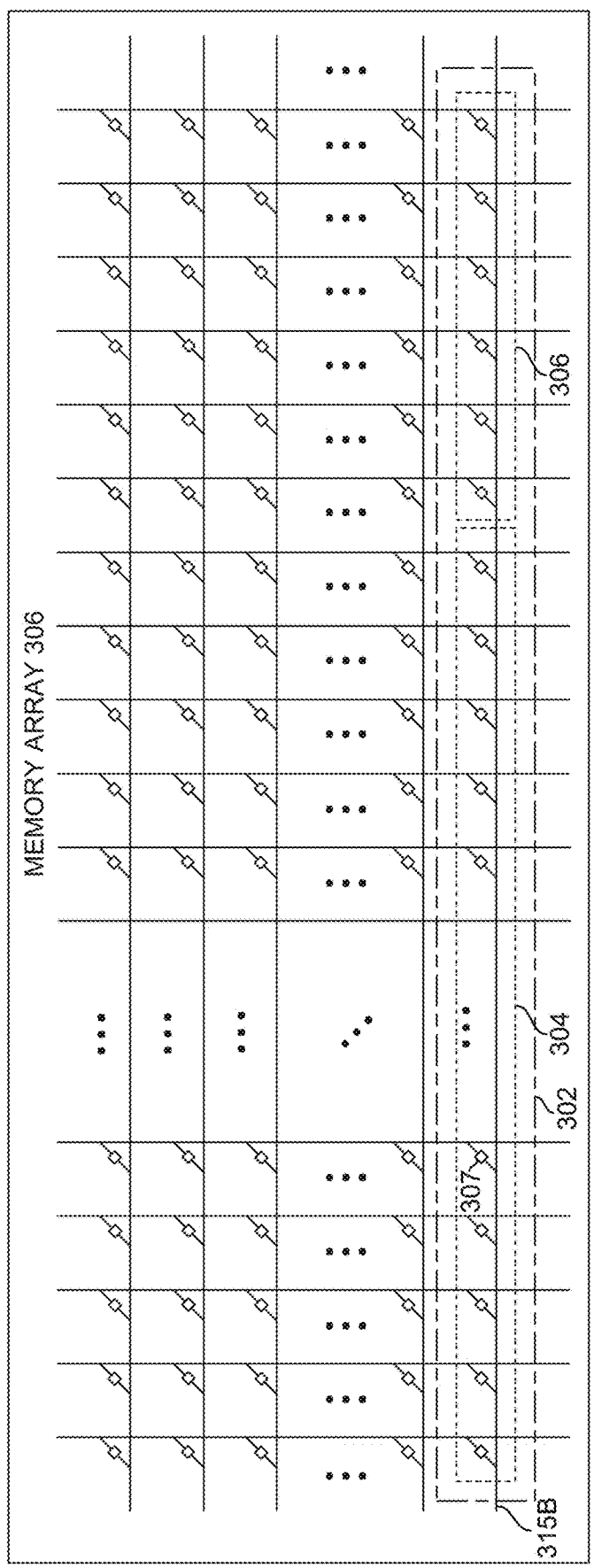
FIG. 3 is a schematic illustration of a memory array in accordance with certain embodiments.

FIG. 3 illustrates a detailed exemplary view of the memory array 206 of FIG. 2 in accordance with certain embodiments. In various embodiments, a plurality of memory cells 207 of memory array 206 may be divided into a logical group such as a slice 302 (and the memory array 206 may include a plurality of slices). In the embodiment depicted, slice 302 includes a plurality of memory cells 207 coupled to the same WL 215A, though a slice 302 may comprise any suitable arrangement of memory cells.

In a particular embodiment, a slice may include a payload portion 304 and a metadata portion 306. The memory cells of the payload portion 304 may store data written to the storage device 106 by a host (e.g., CPU 102/104). For example, the host may send a write command specifying payload data to be written to the storage device 106 at a particular logical address. The payload of the write command may be stored in a payload portion 304 of one or more slices 302 (in various embodiments, the payload portion 304 may be large enough to hold payload data from multiple write commands from the host). In various embodiments, the size of the payload portion of a slice may have any suitable size, such as 1 kibibyte (KiB), 2 KiB, 4 KiB, 8 KiB, or other suitable size.

The memory cells of the metadata portion 306 of a slice 302 may store metadata associated with the payload data stored in the payload portion 304 of the slice 302 or the slice itself. The metadata portion 306 may store any suitable metadata associated with the payload data or slice. For example, the metadata portion 306 may store parity bits and/or cyclic redundancy check (CRC) bits used during error detection and error correction, e.g., by the storage device controller 118. In alternative embodiments, error detection and/or correction may be performed at any suitable level on the storage device 106, such as by the chip controllers 126 or partition controllers.

Figure 4:
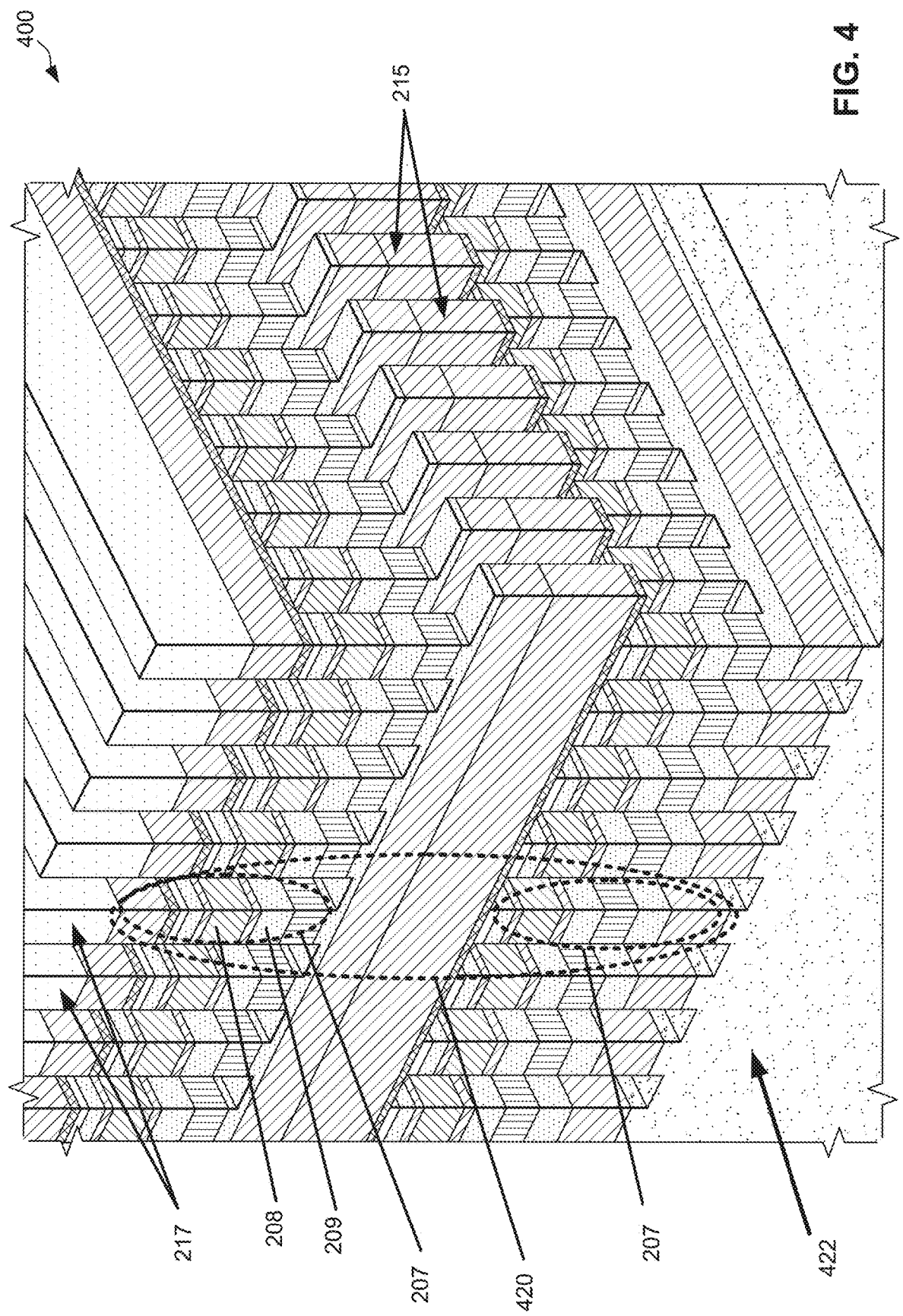
FIG. 4 is a schematic perspective three-dimensional view of a semiconductor structure for a 3D memory architecture according to some embodiments.

FIG. 4 is a perspective diagram of an example of a portion of stack 400 of a 3D crosspoint memory device including memory arrays such as those of FIGS. 2 and 3. The specific layers are merely examples, and will not be described in detail here. Stack 400 is built on substrate structure 422, such as silicon or other semiconductor. Stack 400 includes multiple pillars 420 as memory cell stacks of memory cells 207. In the diagram of stack 400, it will be observed that the WLs and BLs are orthogonal to each other, and traverse or cross each other in a cross-hatch pattern. A crosspoint memory structure includes at least one memory cell in a stack between layers of BL and WL. As illustrated, wordlines (WL) 215 are in between layers of elements, and bitlines (BL) 217 are located at the top of the circuit. Such a configuration is only an example, and the BL and WL structure can be swapped. Thus, in one representation of stack 400, the WLs can be the metal structures labeled as 217, and the BLs can be the metal structures labeled as 215. In one example, the BL and WL are made of tungsten metal. In some instances, WLs and BLs can be referred to as "address lines", referring to signal lines used to address memory cells. Different architectures can use different numbers of stacks of devices, and different configuration of WLs and BLs.

At least some of WLs 215 may correspond to WLs 215 of FIG. 2. At least some of the BLs 217 may correspond to BLs 217 of FIG. 2. Substrate structure 422, such as a silicon substrate, may include control circuitry therein (not shown), such as control circuitry including transistors, row decoders, page buffers, etc. Memory cells 207 may correspond to memory cells 207 of FIG. 2. The control circuitry of substrate structure 422 may include, for example, a memory partition controller such as memory partition controller 210, BL control logic such as BL control logic 216, and WL control logic such as WL control logic 214 of FIG. 2. Each row of WLs 215 extending in the Y direction, the corresponding cells as coupled to corresponding BLs, would define a memory array, and may correspond to a memory array such as memory array 206 of FIGS. 2 and 3. Some of the WLs and some of the BLs may include dummy WLs or dummy BLs (not shown in FIG. 4), corresponding to the dummy WLs and dummy BLs in the dummy array 206B of FIGS. 2 and 3.

Each memory cell 207 of the stack 400 includes a phase change material (PM) layer 208 and select device (SD) layer 209 in series between the WLs 215 and BLs 217. The PM layer 208 and SD layer 209 may be composed of chalcogenide materials as described above. Although shown in a particular order between the WLs 215 and BLs 217, the PM layer 208 and SD layer 209 of the memory cell 207 may be in a different order.

As described above, the memory cells 207 may be encoded into two states, e.g., a SET and RST state based on an application of a first bias voltage to the WL and a second bias voltage to the BL, resulting in a differential bias voltage across the memory cell that may cause a current to flow in the memory element to change the phase of the PM region of the cell. However, embodiments of the present disclosure may allow for the memory cells 207 to be encoded into one of four different states, rather than just the two In this way, capacities of existing memory cells may be increased by 50% or 100% without increasing area overhead or costs to manufacture the memory cells.

In certain embodiments, a first state may be defined by a low VT state in the SD portion and a crystalline state in the PM region (this is similar to the SET state), a second state may be defined by a high VT state in the SD region and an amorphous state in the PM region (this is similar to the RST state), a third state may be defined by a low VT state in the SD region and an amorphous state in the PM region, and a fourth state may be defined by a high VT state in the SD region and a crystalline state in the PM region. To achieve each of these states, certain currents may be applied to the memory cell in a particular amount and duration, which may be based on the properties of the PM and/or SD region materials, the size of the memory cell, or other factors. Examples processes for instantiating each of the four states are described further below.

Figure 5A:
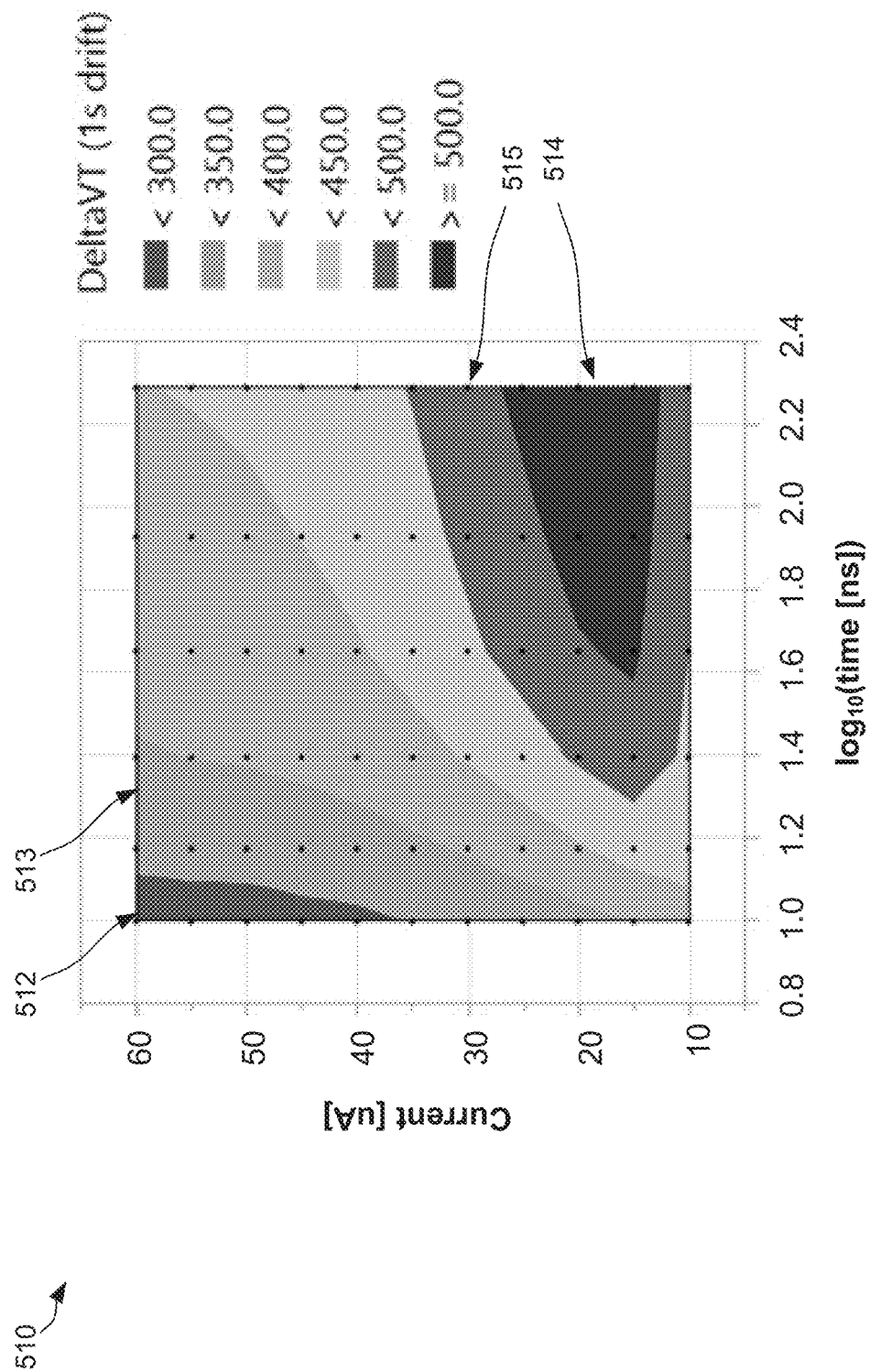
FIGS. 5A-5B illustrate charts that illustrate example behaviors for SD and PM regions, respectively, of a memory cell in accordance with embodiments of the present disclosure.
Figure 5B:
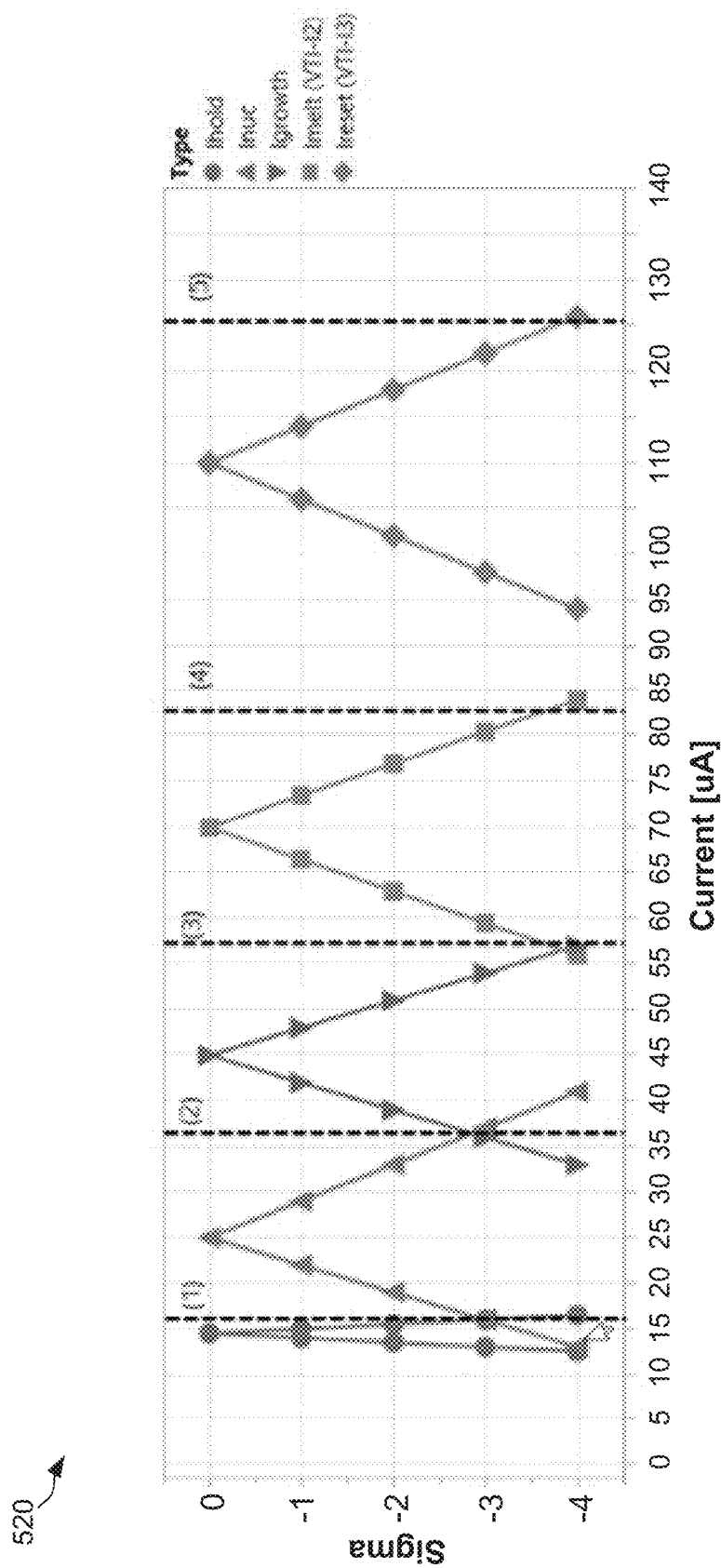

FIGS. 5A-5B illustrate charts 510, 520 that illustrate example behaviors for SD and PM regions, respectively, of a memory cell in accordance with embodiments of the present disclosure. In particular, the chart 510 of FIG. 5A illustrates the change in the threshold voltage (VT) of the SD region of the memory cell based on various amounts of current being applied to the cell and a duration of the currents. In the example shown, the region 512 of the chart 510 may indicate a high VT state of the SD region, while the region 514 of the chart 510 may indicate a low VT state of the SD region. In some cases, the region 513 may also be considered as the high VT state in addition to the region 512, and the region 515 may also be considered as the low VT state in addition to the region 514. For example, a current of 20 uA for approximately 20-40 ns will cause the SD region of the memory cell to be in the low VT state (e.g., providing 300-400 mV of SD memory window). As another example, a current of 60 uA for approximately 10 ns will cause the SD region of the memory cell to be in the high VT state.

Referring to FIG. 5B, a number of current ranges are shown for placing the PM region of a memory cell as described herein into different states. Going from left to right in FIG. 5B, the first range, Ihold, represents an amount of current needed to keep the memory cell on. The second range, Inuc, represents an amount of current that creates nuclei's inside the PM element of the memory cell upon which crystals may begin to grow. The third range, Igrowth, represents an amount of current that causes crystals to grow about the nuclei's created in the Inuc region, and accordingly transforms the physical state of the PM element from the crystalline to the amorphous state. The fourth range, Imelt, represents an amount of current that causes the PM element material to melt, and the fifth range, Ireset, represents an amount of current that provides enough heat to ensure that the PM will be amorphous after quenching the cell, e.g., through a fast shutdown of the Ireset current.

While example current and duration values are shown in FIGS. 5A-5B, it will be understood that the current and duration values may be different for different memory cells, as such values may be based on the size, material, etc. of the SD and/or PM regions of the memory cell. For example, the current values shown in FIGS. 5A-5B may decrease from those shown for smaller memory cell sizes. However, the relative ranges and behaviors may remain similar to those shown in FIGS. 5A-5B.

FIGS. 6A-6B illustrate example current waveforms 602, 604 that may place a memory cell 604 of the present disclosure into a first and second state, respectively. More particularly, the current waveforms shown in FIGS. 6A-6B represent a write process for encoding a memory cell into the first and second states, respectively. The first state may be represented by an amorphous state in the PM region 610 of the memory cell 604 and a high VT state in the SD region 620 of the memory cell 604 as shown in FIG. 6A, while the second state may be represented by a crystalline state in the PM region 610 of the memory cell 604 and a low VT state in the SD region 620 of the memory cell 604 as shown in FIG. 6B. To illustrate the process of placing the memory cell 604 into the first and second states, reference will be made to the charts of FIGS. 5A-5B. In some instances, the first state may be referred to as the "reset" or RST state, and the second state may be referred to as the "set" or SET state. In the examples shown, the currents are applied to the memory cell 604, which includes the PM region 610 and SD region 620 in series with one another.

Referring to FIG. 6A, a first current 612 is applied to the memory cell 604 to turn the memory cell 604 on. The current 612 may be within a range that will allow the memory cell 604 to be operated (e.g., encoded with a state), where the upper end of the range does not begin to place the PM region into the nucleation state as described above. For example, in some instances, the current may be within the Ihold range described above with respect to FIG. 5B, and may be, for example, approximately 12-15 uA. Next, a relatively large current 614 is applied to the memory cell 604. The current 614 may be large enough to cause the PM region to melt and be placed into an amorphous state. For example, referring to the chart 520 of FIG. 5B, the current may be within the Ireset range, e.g., approximately 95-125 uA. The currents 612, 614 may be applied for a duration that is short enough to keep the SD region of the memory cell 604 in the high VT state. For instance, referring to FIG. 5A, the duration of the currents 612, 614 may be approximately 10-15 ns.

Referring to FIG. 6B, a first current 616 is applied to the memory cell 604. The current 616 may be within the Inuc range described above that causes the PM region of the memory cell 604 to enter a nucleation state as described above. For example, referring to FIG. 5B, the current 616 may be within the range of approximately 15-35 uA. Next, a current 617 is applied to the memory cell 604. The current 617 may be larger than the current 616 and may be within a range that causes the PM region of the memory cell 604 to enter a crystal growth state as described above. For example, referring to FIG. 5B, the current 617 may be within the range of approximately 35-55 uA. Next, a current 618 is applied to the memory cell 604 that is lower than the current 617. In some instances, the current 618 may be the same as the current 616 or may be approximately the same. The currents 616, 617, 618 may be applied for a duration that is long enough to place the SD region of the memory cell 604 in the low VT/crystalline state. For instance, referring to FIG. 5A, the total duration of the currents 616, 617, 618 may be approximately 40-100 ns.

FIG. 7 illustrates an example current waveform 702 that may place a memory cell 704 of the present disclosure into a third state in accordance with embodiments of the present disclosure. More particularly, the current waveform shown in FIG. 7 represents a write process for encoding a memory cell into the third state. The third state may be denoted as an "MLC state" or "MLC state 1" herein, where MLC refers to "Multi-Level Cell". The third state may be represented by an amorphous state in the PM region 710 of the memory cell 704 and a low VT state in the SD region 720 of the memory cell 704 as shown. In a read operation, e.g., as described above, the VDM of the third state may be between that of the SET and RST states described above. The VDM of the third state described above may be closer to the VDM of the RST state than the SET state. To illustrate the process of placing the memory cell 704 into the third state, reference will again be made to the charts of FIGS. 5A-5B. In the examples shown, the currents are applied to the memory cell 704, which includes the PM region 710 and SD region 720 in series with one another.

First, the currents 712, 714 are applied to the memory cell 704 to place the PM region of the memory cell 704 into the amorphous state. As shown, a low current square pulse current 712 and a sharp square like pulse current 714, similar to the overall RST currents described above with respect to FIG. 6A, are applied to the memory cell 704. The current 714 may be in the Ireset range described above. A fast quench of the cell is needed to achieve the amorphous state; thus, a fast, complete shutdown of the cell current may be implemented, e.g., in less than 2.5 ns in some instances. Otherwise, the PM region of the memory cell 704 may not become fully amorphous and local crystalline structures may form inside the PM region, leading to a lower window from the MLC state to the SET state.

Next, a delay 716 is used to ensure that the cell is properly shut down before proceeding to the next step. It's important to note that the shutdown rate of memory cells, depending on whether the cell is a fast or slow cell, will require this delay 716 to ensure that all cells will be shut down. In some embodiments, the delay 716 may be greater than 10 ns to ensure all cells are shut down. If the delay is not long enough, a cell may still have a current equal or larger to Ihold passing through the cell when the cell is re-snapped in the next step, and thus may provide a current that may be large enough to grow local crystalline structures in the PM element and/or lower the VT for certain bits. These bits will be later causing a tail in the MLC distribution, causing error, when demarking the SET state from the MLC state 1 in the cells.

After the delay, the SD region of the memory cell 704 is transitioned into the low VT/Crystalline state. After the currents 712, 714 are applied, the SD region will transition into the high VT state, and to achieve the third state shown in FIG. 7, the SD region will need to be brought back to the low VT state. To gain the most SD memory window, the difference between the VT of the low and high VT states, a setback current 718 may be applied. The current 718 may be in the range of the Ihold (e.g., approximately 10 uA) current described above and may have a minimum duration of 20 ns to ensure the SD region transitions into the low VT state. As shown in FIG. 5A, a current of approximately 10 uA held for approximately duration 20 ns, will transition the SD region into the region 515 or 514 of the chart 510.

In certain embodiments, the cell selection and snap may occur using a lower voltage, e.g., VDM4 (~3.8 V), than the typical voltage, e.g., WRITEV (~4.8 V) that is used to snap the cell, as the cell is in a low drift state at this point. Having a high selection voltage may mean higher charge on WLs and BLs, leading to having a current close to nucleation/growth currents, which will disturb the PM for fast cells. A delay between the portions of the pulse may accordingly be needed, for reasons including, but not limited to ensuring the cell snapping when applying the setback pulse.

FIG. 8 illustrates an example current waveform 802 that may place a memory cell 804 of the present disclosure into a fourth state in accordance with embodiments of the present disclosure. More particularly, the current waveform shown in FIG. 8 represents a write process for encoding a memory cell into the fourth state. The fourth state may be represented by a crystalline state in the PM region 810 of the memory cell 804 and a high VT state in the SD region 820 of the memory cell 804 as shown. In a read operation, e.g., as described above, the VDM of the fourth state may be between that of the SET and RST states described above.

The VDM of the fourth state may be closer to the VDM of the SET state than the RST state, whereas the VDM of the third state described above may be closer to the VDM of the RST state than the SET state. To illustrate the process of placing the memory cell 804 into the fourth state, reference will again be made to the charts of FIGS. 5A-5B. In the examples shown, the currents are applied to the memory cell 804, which includes the PM region 810 and SD region 820 in series with one another.

In the example shown, the currents 812, 813, 814 are first applied to the memory cell 804. The currents 812, 813, 814 may be the same as, or similar to, those shown in FIG. 6B, and may place the memory cell into the SET state (i.e., with the PM region in the crystalline state). As a result, the SD region would also be in the low VT state after application of currents 812, 813, 814. In some embodiments, the values shown below in Table 1 for Steps 1-8 may be implemented to apply the currents 812, 813, 814.

Next, a delay 815 is applied to ensure that the memory cell 804 is properly shut down before proceeding to the next step. The time needed to shut down the cell depends on the intrinsic properties of each individual memory cell. Thus, in some instances, a relatively long 110 ns delay time may be used will ensure that even the slowest bits will be shut down before moving to the next step. Without the proper shut down of the cell, there is a chance of disturbing the VT of the SD region.

Next, the currents 816 and 817 are applied to the memory cell to transition the SD region 820 into the high VT/Amorphous state. In some embodiments, the values shown below in Table 1, Steps 9-14 may be used to apply the currents 816, 817. The application of currents 816, 817 may be similar to the write process used to implement the RST state; however, a lower current may be used at 817 than is used for the RST state.

In some embodiments, to properly place the SD region into the high VT state, a current of approximately 45 uA may be applied for even decks, and approximately 65 uA may be applied for odd decks is applied to the cell for 5-15 ns (e.g., 10 ns). Shutting down the cell current at 45-65 uA will ensure that the VT of the SD region will be approximately 250-500 mV higher than that of the SET state, which uses a lower current in the range of 15-30 uA when shutting down the cell. Thus, a fast shutdown of the cell current is needed to ensure that the cell current does not stay in the <30 uA range for more than 2.5 ns. The cell selection, snap, may accordingly happen at a lower voltage, e.g., VDM4 (~3.8 V), than the typical voltage, e.g., WRITEV (~4.8 V), used to snap the cell into the RST state, as the cell is in a low drift state at this point. Having a high selection voltage means higher charge on WLs and BLs, which may lead to having a current close to nucleation/growth currents, which may disturb the PM for some cells.

Figure 9:
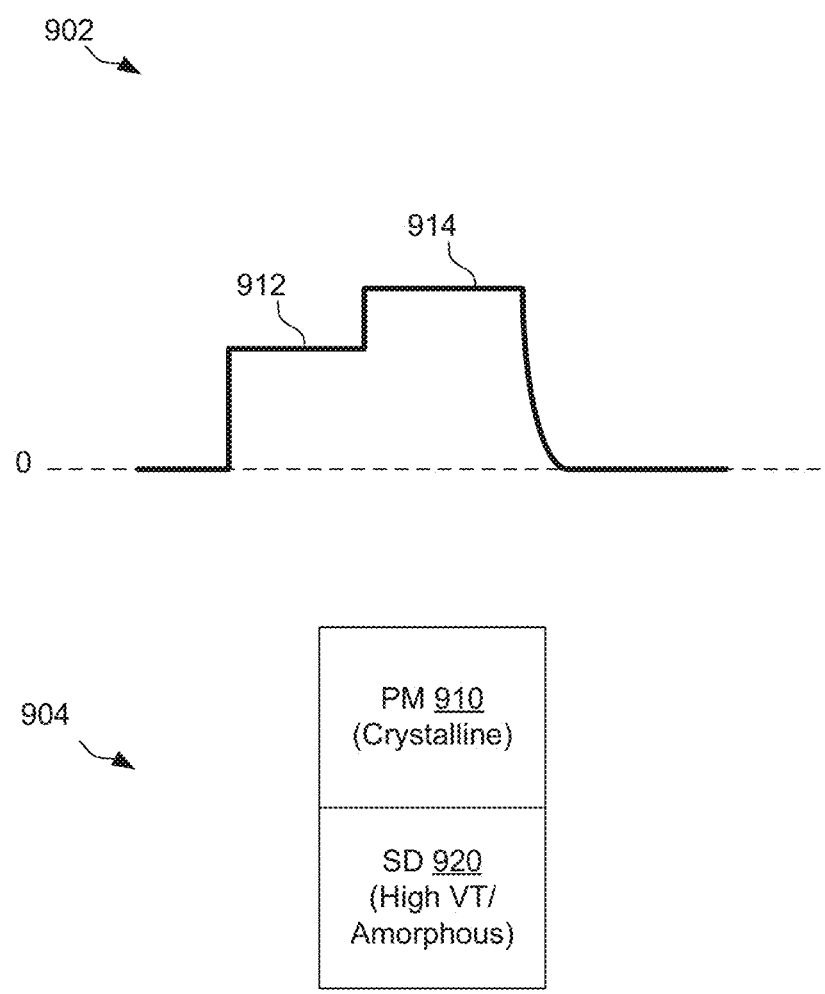
FIG. 9 illustrates another example current waveform that may place a memory cell of the present disclosure into a fourth state in accordance with embodiments of the present disclosure.

FIG. 9 illustrates another example current waveform 902 that may place a memory cell 904 of the present disclosure into a fourth state in accordance with embodiments of the present disclosure. More particularly, the current waveform shown in FIG. 9 represents an alternative write process to the write process shown in FIG. 8 for encoding a memory cell into the fourth state. As in FIG. 8, the fourth state may be represented by a crystalline state in the PM region 910 of the memory cell 904 and a high VT state in the SD region 920 of the memory cell 904 as shown. In a read operation, e.g., as described above, the VDM of the fourth state may be between that of the SET and RST states described above. To illustrate the process of placing the memory cell 904 into the fourth state, reference will again be made to the charts of FIGS. 5A-5B. In the examples shown, the currents are applied to the memory cell 904, which includes the PM region 910 and SD region 920 in series with one another.

In the example shown, the currents 912 and 914 are applied to the memory cell 904. The currents 912, 914 may be the same as, or similar to, a truncated process for encoding the SET state in the memory cell 904 to place the PM region 910 into the crystalline state and the SD region 920 into the high-VT state. In some embodiments, the values shown in Table 1 below, Steps 1-5, may be used to apply the currents 912, 914. For instance, during steps 1-4 of Table 1, the cell is snapped and selected with a relatively low current, e.g., in the range of 25-30 uA being passed through the cell. This causes nucleation in the PM region. Then, at step 5 of Table 1, a larger current, e.g., ~45 uA, is passed through the cell, causing the PM region to transition into the crystalline state. After this, the current is shut down very fast, e.g., in less than 2.5 ns, to make sure that the SD region VT remains 250-500 mV higher than the SD region VT in the SET state. Like the process of FIG. 8, a fast shutdown of the cell current may be needed to ensure that the cell current does not stay in the <30 uA range for more than 2.5 ns. However, unlike the process of FIG. 8, no second snap/selection of the cell is required, allowing the state to be reached in a shorter amount of time.

Table 1 below indicates example voltages applied to WL and BL for a memory cell, corresponding currents in the memory cell, and corresponding timings for implementing the example encoding processes shown in FIGS. 8-9. In particular, the information shown in Table 1 may be used in the encoding process shown in FIG. 8. The encoding process shown in FIG. 9 may utilize the same values as shown in Steps 1-5 of Table 1, as Steps 6-13 are not included in the encoding process of FIG. 9.

TABLE 1

Example address line voltages and memory cell currents to encode the fourth state in the memory cell

| Step | Voltage | Current | Time |
|---|---|---|---|
| Step 1 | BL = 3.1 v, WL = −4 V | 27 uA | 20 ns |
| Step 2 | BL = 3.83 v, WL = −4 V | 27 uA | 20 ns |
| Step 3 | BL = 4.9 V, WL = −4 V | 27 uA | 20 ns |
| Step 4 | BL = 3.83, WL = −4 V | 27 uA | 250 ns |
| Step 5 | BL = 3.83, WL = −4.45 V | 45 uA | 110 ns |
| Step 6 | BL = 3.83, WL = −4 V | 27.5 uA | 15 ns |
| Step 7 | BL = 1.2 v, WL = −4 V | 27.5 uA | 25 ns |
| Step 8 | Delay | | 110 ns |
| Step 9 | BL = 3.1 v, WL = −4 V | 27 uA | 20 ns |
| Step 10 | BL = 3.83 v, WL = −4 V | 27 uA | 20 ns |
| Nucleation | | 27 uA | 30 ns |
| Step 11 | −2 v→−0.89 v | | 20 ns |
| Step 12 | −0.89→vss | | 50 ns |
| Step 13 | BL→5.05 v, WL→−4.45 v | 45 uA/60 uA | 10 ns |

Figure 10:
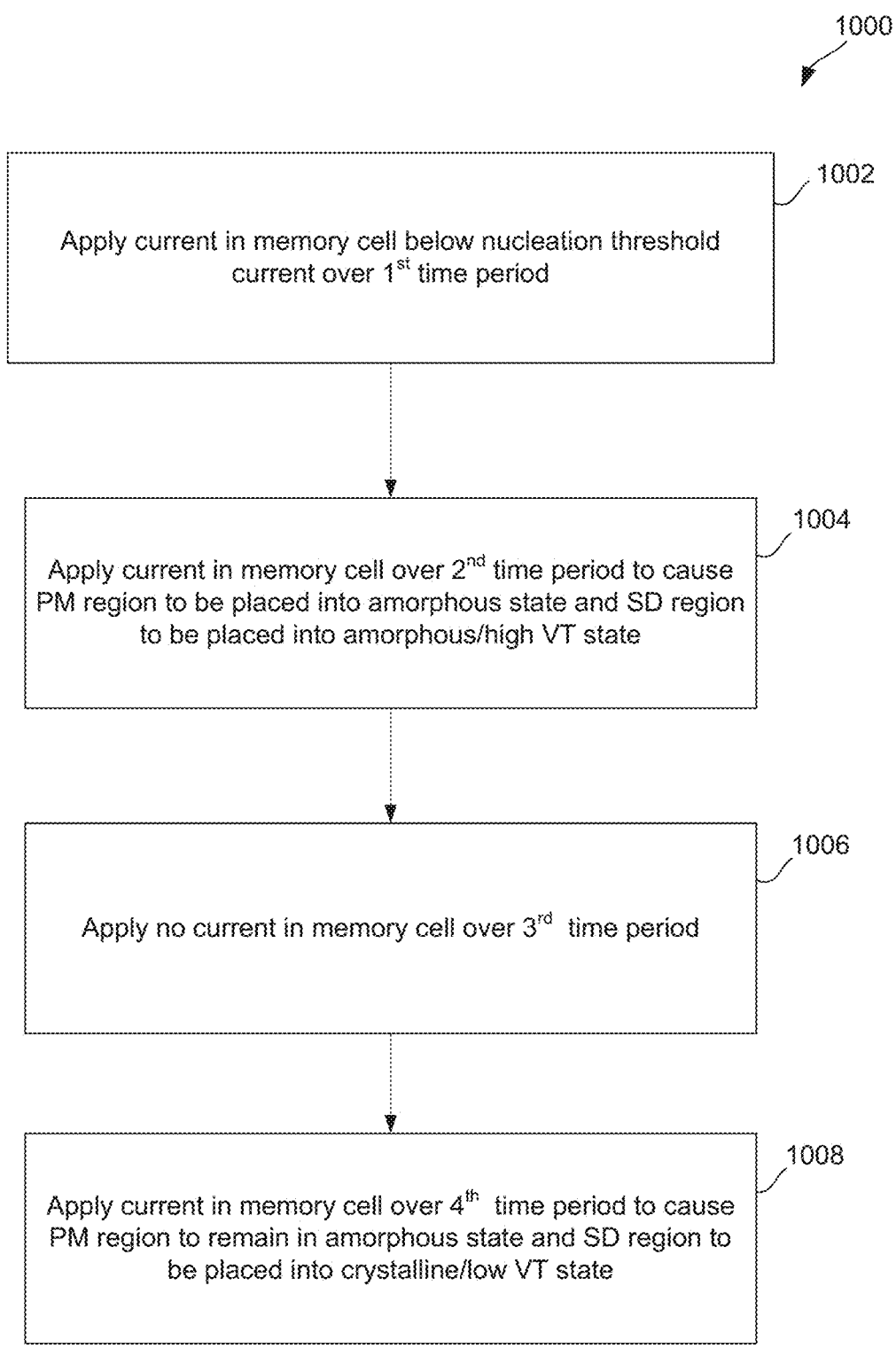
FIG. 10 illustrates an example of a process for encoding a state into a memory cell comprising PM and SD regions in accordance with embodiments of the present disclosure.

FIG. 10 illustrates an example of a process 1000 for encoding a state (e.g., the third state described above) into a memory cell comprising PM and SD regions in accordance with embodiments of the present disclosure. The example process 1000 of FIG. 10 may be performed by way of example at the memory partition controller 210 of FIG. 2, at the memory controller of the CPU, or in a distributed manner across a number of controllers. Further, the flow described in FIG. 10 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 10 may be repeated, combined, modified, or deleted where appropriate. Additionally, operations may be performed in any suitable order without departing from the scope of particular embodiments.

The operations below described below relate to the application of currents to the memory cell, and it will be understood that the application of such currents may be done via application of certain voltages across address lines coupled to the memory cell (e.g., by memory controller circuitry).

At 1002, a current is applied in the memory cell over a first time period. The current applied at 1002 may be beneath a threshold current for causing nucleation within the PM and SD regions of the memory cell, e.g., in the Ihold range as described above.

At 1004, another current, higher than the current at 1002, is applied in the memory cell over a second time period. The amount of current applied at 1004 and/or the duration of the second time period may be such that they cause the PM region of the memory cell to be placed into an amorphous state and the SD region of the memory cell to be placed into an amorphous state. For example, the current may be above a threshold melt current for the PM region of the memory cell, e.g., within the Imelt or Ireset ranges described above.

At 1006, no current is applied in the memory cell over third time period (a delay time period). The delay time period may be long enough to shut down the memory cell before application of the next current at 1008.

At 1008, another current is applied in the memory cell over a fourth time period. The amount of current applied and/or the duration of the fourth time period may be such that they cause the SD region of the memory cell to be placed into a crystalline state and the PM region of the memory cell to remain in the amorphous state. For example, the current at 1008 may be within the Ihold range described above and may be applied for a long enough period of time to cause the SD region to transition into the crystalline/low VT state as described above with respect to FIG. 5A.

Figure 11:
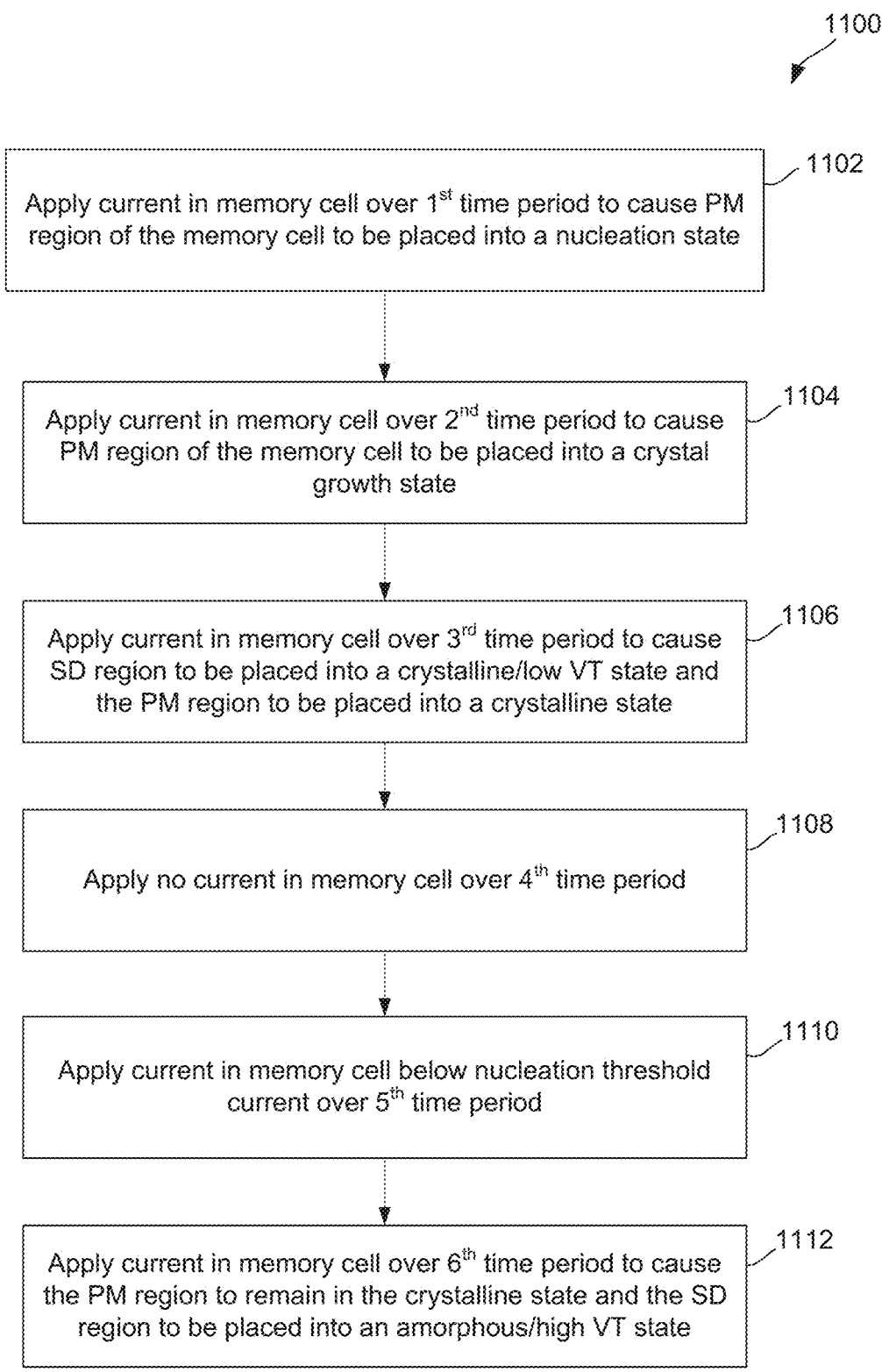
FIG. 11 illustrates another example of a process for encoding a state into a memory cell comprising PM and SD regions in accordance with embodiments of the present disclosure.

FIG. 11 illustrates another example of a process 1100 for encoding a state (e.g., the fourth state described above) into a memory cell comprising PM and SD regions in accordance with embodiments of the present disclosure. The example process 1000 of FIG. 10 may be performed by way of example at the memory partition controller 210 of FIG. 2, at the memory controller of the CPU, or in a distributed manner across a number of controllers. Further, the flow described in FIG. 10 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 10 may be repeated, combined, modified, or deleted where appropriate. Additionally, operations may be performed in any suitable order without departing from the scope of particular embodiments.

The operations below described below relate to the application of currents to the memory cell, and it will be understood that the application of such currents may be done via application of certain voltages across address lines coupled to the memory cell (e.g., by memory controller circuitry).

At 1102, a current is applied in the memory cell over a first time period. The amount of current may be within a range that causes the PM region of the memory cell to be placed into a nucleation state, e.g., the Inuc range described above.

At 1104, a current is applied in the memory cell over a second time period. The amount of current may be within a range that causes the PM region of the memory cell to be placed into a crystal growth state, e.g., the Igrowth range described above.

At 1106, a current is applied in the memory cell over a third time period. The amount of current may be generally within the range of the currents applied at 1102, 1004, e.g., within the Inuc and/or Igrowth ranges described above. The duration of the first, second, and third time periods together may cause the SD region of the memory cell to be placed into a crystalline/low VT state and the PM region of the memory cell to be placed into a crystalline state.

At 1108, no current is applied in the memory cell over fourth time period (a delay time period). The delay time period may be long enough to shut down the memory cell before application of the next current at 1110.

At 1110, a current is applied in the memory cell over a fifth time period. The current applied at 1110 may be beneath a threshold current for causing nucleation within the PM and SD regions of the memory cell, e.g., in the Ihold range as described above.

At 1112, a current is applied in the memory cell over a sixth time period. The amount of current and/or the duration of the sixth time period may be such that they cause the PM region of the memory cell to remain in the crystalline state and the SD region of the memory cell to be placed into an amorphous/high VT state.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HIDL and other functional description language objects can include register transfer language (RTL) files, among other examples. Such objects can be machine-parsable such that a design tool can accept the HIDL object (or model), parse the HIDL object for attributes of the described hardware, and determine a physical circuit and/or on-chip layout from the object. The output of the design tool can be used to manufacture the physical device. For instance, a design tool can determine configurations of various hardware and/or firmware elements from the HIDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable storage medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory chip 116, storage device controller 118, address translation engine 120, memory partition 122, program control logic 124, chip controller 126, memory array 306, memory partition controller 310, word line control logic 314, bit line control logic 316, or other entity or component described herein, or subcomponents of any of these. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a The machine-readable storage medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage medium used in the transmission of information over the Internet via electrical, optical, acoustical or other forms of propagated signals (e.g., carrier waves, infrared signals, digital signals, etc.). Accordingly, the computer-readable medium includes any type of tangible machine-readable storage medium suitable for storing or transmitting electronic instructions or information in a form readable by a machine (e.g., a computer).

Some examples of embodiments are provided below.

Example 1 includes a non-volatile memory device comprising: a memory array comprising: a plurality of non-volatile memory cells, each memory cell comprising a phase change material (PM) region and a select device (SD) region in series with the PM region; and address lines to apply voltages across the memory cells; memory controller circuitry to interface with the address lines of the memory cells, the memory controller circuitry to encode a state in a memory cell by: applying a first voltage across a set of address lines over a first time period to cause a first current to flow in the memory cell, wherein the first current applied over the first time period causes the PM region of the memory cell to be placed into an amorphous state and the SD region of the memory cell to be placed into an amorphous state; and applying a second voltage across the set of address lines over a second time period after the first time period to cause a second current to flow in the memory cell, wherein the second current applied over the third time period causes the SD region of the memory cell to be placed into a crystalline state and the PM region of the memory cell to remain in the amorphous state.

Example 2 includes the subject matter of Example 1, wherein the first voltage is to cause the first current to be in the range of approximately 95-125 uA.

Example 3 includes the subject matter of Example 1 or 2, wherein the second voltage is cause the second current to be approximately 10 uA and the second time period is greater than or equal to 20 ns.

Example 4 includes the subject matter of Examples 1-3, wherein the memory controller circuitry is to encode the state in the memory cell further by applying no voltage across the set of address lines over a third time period between the first time period and the second time period.

Example 5 includes the subject matter of Example 4, wherein the third time period is greater than or equal to 10 ns.

Example 6 includes the subject matter of any one of Examples 1-5, wherein the memory controller circuitry is to encode the state in the memory cell further by applying a third voltage over a third time period before the first time period to cause a third current in the memory cell that is below a threshold current to cause nucleation in the PM region of the memory cell.

Example 7 includes the subject matter of Example 6, wherein the third voltage is to cause the third current to be in the range of approximately 12-15 uA, and the first and third time periods together are in the range of approximately 10 ns-15 ns.

Example 8 includes the subject matter of any one of Examples 1-7, wherein the PM region of the memory cell comprises a chalcogenide material, and the SD region of the memory cell comprises a chalcogenide material.

Example 9 includes the subject matter of any one of Examples 1-8, wherein the memory controller circuitry comprises word line control circuitry to apply voltages to a first set of the address lines, bit line control circuitry to apply voltages to a second set of the address lines, partition controller circuitry to control application of the voltages to the word lines via the word line control circuitry and to the bit lines via the bit line control circuitry, and interface circuitry between the partition controller circuitry and the word line control circuitry and between the partition controller circuitry and the bit line control circuitry.

Example 10 includes a memory module comprising: input/output (I/O) circuitry to couple the memory module with an external controller; and a plurality of non-volatile memory devices according to any one of Examples 1-9.

Example 11 includes a method of encoding a state in a memory cell comprising a phase change material (PM) region and a select device (SD) region in series, the method comprising: applying a first current in the memory cell over a first time period, wherein the first current applied over the first time period causes the PM region of the memory cell to be placed into an amorphous state and the SD region of the memory cell to be placed into an amorphous state; and applying a second current in the memory cell over a second time period after the first time period, wherein the second current applied over the third time period causes the SD region of the memory cell to be placed into a crystalline state and the PM region of the memory cell to remain in the amorphous state.

Example 12 includes the subject matter of Example 11, wherein the first current is in the range of approximately 95-125 uA.

Example 13 includes the subject matter of Example 11 or 12, wherein the second current is approximately 10 uA and the second time period is greater than or equal to 20 ns.

Example 14 includes the subject matter of any one of Examples 11-13, further comprising applying no current in the memory cell over a third time period between the first time period and the second time period.

Example 15 includes the subject matter of Example 14, wherein the third time period is greater than or equal to 10 ns.

Example 16 includes the subject matter of any one of Examples 11-15, further comprising applying a third current in the memory cell over a third time period before the first time period, wherein the third current is below a threshold current to cause nucleation in the PM region of the memory cell.

Example 17 includes the subject matter of Example 16, wherein the third current is in the range of approximately 12-15 uA and the first and third time periods together are in the range of approximately 10 ns-15 ns.

Example 18 includes an apparatus comprising: a memory cell comprising a phase change material (PM) region and a select device (SD) region; means to encode states into the memory cell by any one of the methods of Examples 11-17.

Example 19 includes a tangible non-transitory machine-readable storage medium having instructions stored thereon, the instructions when executed by a machine to cause the machine to encode a state in a memory cell comprising a phase change material (PM) region and a select device (SD) region in series by: applying a first voltage across a set of address lines coupled to the memory cell over a first time period to cause a first current to flow in the memory cell, wherein the first current applied over the first time period causes the PM region of the memory cell to be placed into an amorphous state and the SD region of the memory cell to be placed into an amorphous state; and applying a second voltage across the set of address lines over a second time period after the first time period to cause a second current to flow in the memory cell, wherein the second current applied over the third time period causes the SD region of the memory cell to be placed into a crystalline state and the PM region of the memory cell to remain in the amorphous state Example 20 includes the subject matter of Example 19, wherein the first voltage is to cause the first current to be in the range of approximately 95-125 uA.

Example 21 includes the subject matter of Example 19 or 20, wherein the second voltage is to cause the second current to be approximately 10 uA and the second time period is greater than or equal to 20 ns.

Example 22 includes the subject matter of any one of Examples 19-21, wherein the instructions are further to cause the machine to encode the state in the memory cell by applying no current in the memory cell over a third time period between the first time period and the second time period.

Example 23 includes the subject matter of Example 22, wherein the third time period is greater than or equal to 10 ns.

Example 24 includes the subject matter of any one of Examples 19-23, wherein the instructions are further to cause the machine to encode the state in the memory cell by applying a third current in the memory cell over a third time period before the first time period, wherein the third current is below a threshold current to cause nucleation in the PM region of the memory cell.

Example 25 includes the subject matter of Example 24, wherein the third voltage is to cause the third current to be in the range of approximately 12-15 uA and the first and third time periods together are in the range of approximately 10 ns-15 ns.

Example 26 includes a non-volatile memory device comprising: a memory array comprising: a plurality of non-volatile memory cells, each memory cell comprising a phase change material (PM) region and a select device (SD) region in series with the PM region; and address lines to apply voltages across the memory cells; memory controller circuitry to interface with the address lines of the memory cells, the memory controller circuitry to encode a state in a memory cell by: applying a first voltage across a set of address lines over a first time period to cause a first current to flow in the memory cell, wherein the first current causes the PM region of the memory cell to be placed into a nucleation state; applying a second voltage across the set of address lines over a second time period after the first time period to cause a second current to flow in the memory cell, wherein the second current causes the PM region of the memory cell to be placed into a crystal growth state; applying a third voltage across the set of address lines over a third time period after the second time period to cause a third current to flow in the memory cell, wherein the first, second, and third currents applied over the first, second, and third time periods cause the SD region of the memory cell to be placed into a crystalline state and the PM region of the memory cell to be placed into a crystalline state; and applying a fourth voltage across the set of address lines over a fourth time period after the third time period to cause a fourth current to flow in the memory cell, wherein the fourth current applied over the fourth time period causes the PM region of the memory cell to remain in the crystalline state and the SD region of the memory cell to be placed into an amorphous state.

Example 27 includes the subject matter of Example 26, wherein the first voltage is to cause the first current to be in the range of approximately 15-35 uA.

Example 28 includes the subject matter of Example 26 or 27, wherein the second voltage is to cause the second current to be in the range of approximately 35-55 uA.

Example 29 includes the subject matter of any one of Examples 26-28, wherein the third voltage is to cause the third current to be in the range of approximately 15-35 uA.

Example 30 includes the subject matter of any one of Examples 26-29, wherein the first, second, and third time periods together are in the range of approximately 40-100 ns.

Example 31 includes the subject matter of any one of Examples 26-30, wherein the memory controller circuitry is to encode the state in the memory cell further by applying no voltage across the set of address lines over a fifth time period between the third time period and the fourth time period.

Example 32 includes the subject matter of Example 31, wherein the fifth time period is greater than or equal to 110 ns.

Example 33 includes the subject matter of any one of Examples 26-32, wherein the memory controller circuitry is to encode the state in the memory cell further by applying a fifth voltage across the set of address lines over a fifth time period between the third time period and the fourth time period.

Example 34 includes the subject matter of Example 33, wherein the fifth voltage is to cause a fifth current to flow in the memory cell that is in the range of approximately 20-30 uA and the fifth time period is between 15-40 ns.

Example 35 includes the subject matter of any one of Examples 26-34, wherein the fourth voltage is to cause the fourth current to be in the range of approximately 45-65 uA and the fourth time period is between approximately 5-15 ns.

Example 36 includes a memory module comprising: input/output (I/O) circuitry to couple the memory module with an external controller; and a plurality of non-volatile memory devices according to any one of Examples 26-35.

Example 37 includes a method of encoding a state in a memory cell comprising a phase change material (PM) region and a select device (SD) region in series, the method comprising: applying a first current in the memory cell over a first time period, wherein the first current causes the PM region of the memory cell to be placed into a nucleation state; applying a second current in the memory cell over a second time period after the first time period, wherein the second current causes the PM region of the memory cell to be placed into a crystal growth state; applying a third current in the memory cell over a third time period after the second time period, wherein the first, second, and third currents applied over the first, second, and third time periods cause the SD region of the memory cell to be placed into a crystalline state and the PM region of the memory cell to be placed into a crystalline state; and applying a fourth current in the memory cell over a fourth time period after the third time period, wherein the fourth current applied over the fourth time period causes the PM region of the memory cell to remain in the crystalline state and the SD region of the memory cell to be placed into an amorphous state.

Example 38 includes the subject matter of Example 37, wherein the first current is in the range of approximately 15-35 uA.

Example 39 includes the subject matter of Example 37 or 38, wherein the second current is in the range of approximately 35-55 uA.

Example 40 includes the subject matter of any one of Examples 37-39, wherein the third current is in the range of approximately 15-35 uA.

Example 41 includes the subject matter of any one of Examples 37-40, wherein the first, second, and third time periods together are in the range of approximately 40-100 ns.

Example 42 includes the subject matter of any one of Examples 37-41, further comprising applying no current in the memory cell over a fifth time period between the third time period and the fourth time period.

Example 43 includes the subject matter of Example 42, wherein the fifth time period is greater than or equal to 110 ns.

Example 44 includes the subject matter of any one of Examples 37-43, further comprising applying a fifth current in the memory cell over a fifth time period between the third time period and the fourth time period.

Example 45 includes the subject matter of Example 44, wherein the fifth current is in the range of approximately 20-30 uA and the fifth time period is between 15-40 ns.

Example 46 includes the subject matter of any one of Examples 37-45, wherein the fourth current is in the range of approximately 45-65 uA and the fourth time period is between approximately 5-15 ns.

Example 47 includes an apparatus comprising: a memory cell comprising a phase change material (PM) region and a select device (SD) region; and means to encode states into the memory cell by any one of the methods of Examples 37-46.

Example 48 includes a tangible non-transitory machine-readable storage medium having instructions stored thereon, the instructions when executed by a machine to cause the machine to encode a state in a memory cell comprising a phase change material (PM) region and a select device (SD) region in series by: applying a first voltage across a set of address lines coupled to the memory cell over a first time period to cause a first current to flow in the memory cell, wherein the first current causes the PM region of the memory cell to be placed into a nucleation state; applying a second voltage across the set of address lines over a second time period after the first time period to cause a second current to flow in the memory cell, wherein the second current causes the PM region of the memory cell to be placed into a crystal growth state; applying a third voltage across the set of address lines over a third time period after the second time period to cause a third current to flow in the memory cell, wherein the first, second, and third currents applied over the first, second, and third time periods cause the SD region of the memory cell to be placed into a crystalline state and the PM region of the memory cell to be placed into a crystalline state; and applying a fourth voltage across the set of address lines over a fourth time period after the third time period to cause a fourth current to flow in the memory cell, wherein the fourth current applied over the fourth time period causes the PM region of the memory cell to remain in the crystalline state and the SD region of the memory cell to be placed into an amorphous state.

Example 49 includes the subject matter of Example 48, wherein the first voltage is to cause the first current to be in the range of approximately 15-35 uA.

Example 50 includes the subject matter of Example 48 or 49, wherein the second voltage is to cause the second current to be in the range of approximately 35-55 uA.

Example 51 includes the subject matter of any one of Examples 48-50, wherein the third voltage is to cause the third current to be in the range of approximately 15-35 uA.

Example 52 includes the subject matter of any one of Examples 48-51, wherein the first, second, and third time periods together are in the range of approximately 40-100 ns.

Example 53 includes the subject matter of any one of Examples 48-52, wherein the memory controller circuitry is to encode the state in the memory cell further by applying no voltage across the set of address lines over a fifth time period between the third time period and the fourth time period.

Example 54 includes the subject matter of Example 53, wherein the fifth time period is greater than or equal to 110 ns.

Example 55 includes the subject matter of any one of Examples 48-54, wherein the memory controller circuitry is to encode the state in the memory cell further by applying a fifth voltage across the set of address lines over a fifth time period between the third time period and the fourth time period.

Example 56 includes the subject matter of Example 55, wherein the fifth voltage is to cause a fifth current to flow in the memory cell that is in the range of approximately 20-30 uA and the fifth time period is between 15-40 ns.

Example 57 includes the subject matter of any one of Examples 48-56, wherein the fourth voltage is to cause the fourth current to be in the range of approximately 45-65 uA and the fourth time period is between approximately 5-15 ns.

Example 58 includes a device comprising: one or more processors and one or more computer-readable media comprising instructions that, when executed by the one or more processors, cause the one or more processors to perform the method, techniques, or process as described in or related to any of the Examples above, or portions thereof.

Example 59 includes a signal as described in or related to any of the Examples above, or portions or parts thereof.

Example 60 includes a signal encoded with data as described in or related to any of the Examples above, or portions or parts thereof, or otherwise described in the present disclosure.

Example 61 includes an electromagnetic signal carrying computer-readable instructions, wherein execution of the computer-readable instructions by one or more processors is to cause the one or more processors to perform the method, techniques, or process as described in or related to any of the Examples above, or portions thereof.

Example 62 includes a computer program comprising instructions, wherein execution of the program by a processing element is to cause the processing element to carry out the method, techniques, or process as described in or related to any of the Examples above, or portions thereof.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A non-volatile memory device comprising:
a memory array comprising:
a plurality of non-volatile memory cells, each memory cell comprising a phase change material (PM) region and a select device (SD) region in series with the PM region; and
address lines to apply voltages across the memory cells;
memory controller circuitry to interface with the address lines of the memory cells, the memory controller circuitry to encode a state in a memory cell by:
applying a first voltage across a set of address lines over a first time period to cause a first current to flow in the memory cell, wherein the first current applied over the first time period causes the PM region of the memory cell to be placed into an amorphous state and the SD region of the memory cell to be placed into an amorphous state; and
applying a second voltage across the set of address lines over a second time period after the first time period to cause a second current to flow in the memory cell, wherein the second current applied over the second time period causes the SD region of the memory cell to be placed into a crystalline state and the PM region of the memory cell to remain in the amorphous state.

2. The memory device of claim 1, wherein the first voltage is to cause the first current to be in the range of approximately 95-125 uA.

3. The memory device of claim 1, wherein the second voltage is cause the second current to be approximately 10 uA and the second time period is greater than or equal to 20 ns.

4. The memory device of claim 1, wherein the memory controller circuitry is to encode the state in the memory cell further by applying no voltage across the set of address lines over a third time period between the first time period and the second time period.

5. The memory device of claim 4, wherein the third time period is greater than or equal to 10 ns.

6. The memory device of claim 1, wherein the memory controller circuitry is to encode the state in the memory cell further by applying a third voltage over a third time period before the first time period to cause a third current in the memory cell that is below a threshold current to cause nucleation in the PM region of the memory cell.

7. The memory device of claim 6, wherein the third voltage is to cause the third current to be in the range of approximately 12-15 uA, and the first and third time periods together are in the range of approximately 10 ns-15 ns.

8. The memory device of claim 1, wherein the PM region of the memory cell comprises a chalcogenide material, and the SD region of the memory cell comprises a chalcogenide material.

9. The memory device of claim 1, wherein the memory controller circuitry comprises word line control circuitry to apply voltages to a first set of the address lines, bit line control circuitry to apply voltages to a second set of the address lines, partition controller circuitry to control application of the voltages to the word lines via the word line control circuitry and to the bit lines via the bit line control circuitry, and interface circuitry between the partition controller circuitry and the word line control circuitry and between the partition controller circuitry and the bit line control circuitry.

10. A method of encoding a state in a memory cell comprising a phase change material (PM) region and a select device (SD) region in series, the method comprising:
applying a first current in the memory cell over a first time period, wherein the first current applied over the first time period causes the PM region of the memory cell to be placed into an amorphous state and the SD region of the memory cell to be placed into an amorphous state; and
applying a second current in the memory cell over a second time period after the first time period, wherein the second current applied over the second time period causes the SD region of the memory cell to be placed into a crystalline state and the PM region of the memory cell to remain in the amorphous state.

11. The method of claim 10, further comprising applying no current in the memory cell over a third time period between the first time period and the second time period.

12. The method of claim 10, further comprising applying a third current in the memory cell over a third time period before the first time period, wherein the third current is below a threshold current to cause nucleation in the PM region of the memory cell.

13. A non-volatile memory device comprising:
a memory array comprising:
a plurality of non-volatile memory cells, each memory cell comprising a phase change material (PM) region and a select device (SD) region in series with the PM region; and
address lines to apply voltages across the memory cells;
memory controller circuitry to interface with the address lines of the memory cells, the memory controller circuitry to encode a state in a memory cell by:
applying a first voltage across a set of address lines over a first time period to cause a first current to flow in the memory cell, wherein the first current causes the PM region of the memory cell to be placed into a nucleation state;
applying a second voltage across the set of address lines over a second time period after the first time period to cause a second current to flow in the memory cell, wherein the second current causes the PM region of the memory cell to be placed into a crystal growth state;
applying a third voltage across the set of address lines over a third time period after the second time period to cause a third current to flow in the memory cell, wherein the first, second, and third currents applied over the first, second, and third time periods cause the SD region of the memory cell to be placed into a crystalline state and the PM region of the memory cell to be placed into a crystalline state; and
applying a fourth voltage across the set of address lines over a fourth time period after the third time period to cause a fourth current to flow in the memory cell, wherein the fourth current applied over the fourth time period causes the PM region of the memory cell to remain in the crystalline state and the SD region of the memory cell to be placed into an amorphous state.

14. The non-volatile memory device of claim 13, wherein the first voltage is to cause the first current to be in the range of approximately 15-35 uA.

15. The non-volatile memory device of claim 13, wherein the second voltage is to cause the second current to be in the range of approximately 35-55 uA.

16. The non-volatile memory device of claim 13, wherein the third voltage is to cause the third current to be in the range of approximately 15-35 uA.

17. The non-volatile memory device of claim 13, wherein the first, second, and third time periods together are in the range of approximately 40-100 ns.

18. The non-volatile memory device of claim 13, wherein the memory controller circuitry is to encode the state in the memory cell further by applying no voltage across the set of address lines over a fifth time period between the third time period and the fourth time period.

19. The non-volatile memory device of claim 18, wherein the fifth time period is greater than or equal to 110 ns.

20. The non-volatile memory device of claim 13, wherein the memory controller circuitry is to encode the state in the memory cell further by applying a fifth voltage across the set of address lines over a fifth time period between the third time period and the fourth time period.

21. The non-volatile memory device of claim 20, wherein the fifth voltage is to cause a fifth current to flow in the memory cell that is in the range of approximately 20-30 uA and the fifth time period is between 15-40 ns.

22. The non-volatile memory device of claim 13, wherein the fourth voltage is to cause the fourth current to be in the range of approximately 45-65 uA and the fourth time period is between approximately 5-15 ns.

23. A method of encoding a state in a memory cell comprising a phase change material (PM) region and a select device (SD) region in series, the method comprising:
applying a first current in the memory cell over a first time period, wherein the first current causes the PM region of the memory cell to be placed into a nucleation state;
applying a second current to flow in the memory cell over a second time period after the first time period, wherein the second current causes the PM region of the memory cell to be placed into a crystal growth state;
applying a third current in the memory cell over a third time period after the second time period, wherein the first, second, and third currents applied over the first, second, and third time periods cause the SD region of the memory cell to be placed into a crystalline state and the PM region of the memory cell to be placed into a crystalline state; and
applying a fourth current in the memory cell over a fourth time period after the third time period, wherein the fourth current applied over the fourth time period causes the PM region of the memory cell to remain in the crystalline state and the SD region of the memory cell to be placed into an amorphous state.

24. The method of claim 23, further comprising applying no current in the memory cell over a fifth time period between the third time period and the fourth time period.

25. The method of claim 23, further comprising applying a fifth current in the memory cell over a fifth time period between the third time period and the fourth time period.

* * * * *